United States Patent [19]

Tanabe et al.

[11] Patent Number: 5,270,028
[45] Date of Patent: Dec. 14, 1993

[54] DIAMOND AND ITS PREPARATION BY CHEMICAL VAPOR DEPOSITION METHOD

[75] Inventors: Keiichiro Tanabe; Takahiro Imai; Naoji Fujimori, all of Itami, Japan

[73] Assignee: Sumitomo Electric Industries, Ltd., Osaka, Japan

[21] Appl. No.: 884,891

[22] Filed: May 18, 1992

Related U.S. Application Data

[63] Continuation of Ser. No. 563,617, Aug. 7, 1990, abandoned, which is a continuation-in-part of Ser. No. 304,657, Feb. 1, 1989, abandoned.

[30] Foreign Application Priority Data

Feb. 1, 1988 [JP] Japan .................. 63-22640

[51] Int. Cl.$^5$ ............................................. C01B 31/06
[52] U.S. Cl. .................................... 423/446; 427/577; 156/DIG. 68
[58] Field of Search ............... 423/446; 156/DIG. 68; 427/39, 577, 450; 204/173; 501/86

[56] References Cited

U.S. PATENT DOCUMENTS

| 3,630,677 | 12/1971 | Angus | 423/446 |
| 3,749,760 | 7/1973 | Deryagin | 423/446 |
| 3,961,103 | 6/1976 | Aisenberg | 427/39 |
| 4,434,188 | 2/1984 | Kamo et al. | 423/446 |
| 4,767,608 | 8/1988 | Matsumoto et al. | 423/446 |

FOREIGN PATENT DOCUMENTS

| 628567 | 10/1961 | Canada | 423/446 |
| 0161829 | 11/1985 | European Pat. Off. | |
| 0254312 | 1/1988 | European Pat. Off. | |
| 0254560 | 1/1988 | European Pat. Off. | |
| 59-137396 | 8/1984 | Japan | 423/446 |
| 60-54995 | 3/1985 | Japan | 423/446 |
| 60-112698 | 6/1985 | Japan | 423/446 |
| 60-118694 | 6/1985 | Japan | 423/446 |
| 60-127293 | 7/1985 | Japan | 423/446 |

OTHER PUBLICATIONS

Tobioka, "Patent Abstracts of Japan", Jan. 13, 1988, vol. 12, No. 11, JP-A-62 164 878.

Fujii, "Patent Abstracts of Japan", Feb. 13, 1986, vol. 10, No. 36, JP-A-60 186 500.

"Chemical Abstracts", Apr. 1981, p. 149, Abstract No. 124025x.

Kikuchi, "Patent Abstracts of Japan", Feb. 20, 1989, vol. 10, No. 43, JP-A-60 191 097.

Hirose and Terasawa, "Japanese Journal of Applied Physics", Synthesis of Diamond Thin Films by Thermal CVD Using Organic Compounds, Jun. 1986, p. L519, Table 1, vol. 25, No. 6, Part II.

*Primary Examiner*—Robert Kunemund
*Attorney, Agent, or Firm*—Cushman, Darby & Cushman

[57] ABSTRACT

A diamond having improved properties is produced by a method which comprises introducing a mixture of hydrogen (A), an inert gas (B) and a carbon-containing compound (C) in molar ratios which satisfy the following equations:

$$0.001 \leq \frac{B}{A + B + C} \leq 0.95$$

and $$0.001 \leq \frac{C}{A + B + C} \leq 0.1,$$

generating a low temperature plasma with one of direct current and an alternating current electromagnetic field under pressure of 5 to 760 Torr to form the diamond on a substrate, wherein there is no substantial differnce between a place where the plasma is generated and a place where the diamond is formed on the substrate.

11 Claims, 2 Drawing Sheets

DIAMOND AND ITS PREPARATION BY CHEMICAL VAPOR DEPOSITION METHOD

CROSS-REFERENCE to RELATES APPLICATION

This is a continuation of application Ser. No. 07/563,617, filed on Aug. 7, 1990, now abandoned, which is a continuation-in-part of Ser. No. 07/304,657 filed on Feb. 1, 1989, now abandoned.

BACKGROUND OF THE INVENTION

1. Field of the Invention

The present invention relates to diamond and its preparation by a chemical vapor deposition method using a low temperature plasma. More particularly, the present invention relates to a method for producing the high quality diamond or covering a substrate having the high quality diamond at a high rate with a low temperature plasma. The present invention is applied in various fields which require high heat conductivity, low dielectricity, good optical transmission, high specific elasticity, high strength, good wear resistance, etc, such as window materials, diaphragms, cutting tools, heat sinks, IC bonders and the like.

2. Description of the Related Art

Hitherto, the diamond is synthesized in a thermodynamically equilibrium state at high temperature under high pressure. Recently, the diamond can be synthesized by a chemical vapor deposition (CVD) method which positively utilizes an non-equilibrium state.

As the CVD methods for synthesizing the diamond, various methods comprising exciting a mixture of a hydrocarbon and a ten time volume of hydrogen with plasma or a heating filament. For example, Japanese Patent Kokai Publication No. 91100/1983 discloses a method comprising preheating the mixture of the hydrocarbon and hydrogen with a thermionic emission material kept at a temperature not lower than 1,000° C. and introducing the preheated mixture onto a heated substrate surface to deposit the diamond through pyrolysis of the hydrocarbon. Japanese Patent Kokai Publication No. 110494/1983 discloses a method comprising flowing the hydrogen gas through microwave electrodeless discharge, mixing the hydrogen gas with the hydrocarbon and then depositing the diamond on the substrate through pyrolysis of the hydrocarbon. Japanese Patent Kokai Publication No. 3098/1984 discloses a method comprising introducing a microwave in the mixture of the hydrocarbon and hydrogen to generate a plasma, heating a substrate placed in the plasma at a temperature of 300° to 1,300° C. to deposit the diamond on the substrate through pyrolysis of the hydrocarbon.

Since the conventional CVD methods for synthesizing the diamond use the mixture essentially consisting of hydrogen and a carbon-containing compound (for example, hydrocarbons), the plasma is stably generated at a comparatively low pressure up to about 50 Torr. Therefore, synthesis conditions, synthesis rates and synthesis areas are restricted, which limits application of the diamond synthesis by the CVD methods.

SUMMARY OF THE INVENTION

One object of the present invention is to provide a high quality diamond synthesized by the CVD method.

Another object of the present invention is to provide an improved CVD method for producing a diamond, by which the diamond with good quality can be produced at a high rate.

These and other objects are accomplished by a method of the present invention which comprises steps of introducing a mixture of hydrogen (A), an inert gas (B) and a carbon-containing compound (C) in molar ratios which satisfy the following equations:

$$0.001 \leq \frac{B}{A+B+C} \leq 0.95$$

and $$0.001 \leq \frac{C}{A+B+C} \leq 0.1,$$

generating a low temperature plasma with one of a direct current and an alternating current electromagnetic field under pressure of 5 to 760 Torr. to form the diamond on a substrate, wherein there is no substantial pressure difference between a place where the low temperature plasma is generated and a place where the diamond is formed on the substrate.

According to the method of the present invention, the diamond can be synthesized homogeneously at a rate several hundreds times faster than the conventional method which use no inert gas on a wide area of, for example, several ten square millimeter.

DETAILED DESCRIPTION OF THE INVENTION

Figure 1:
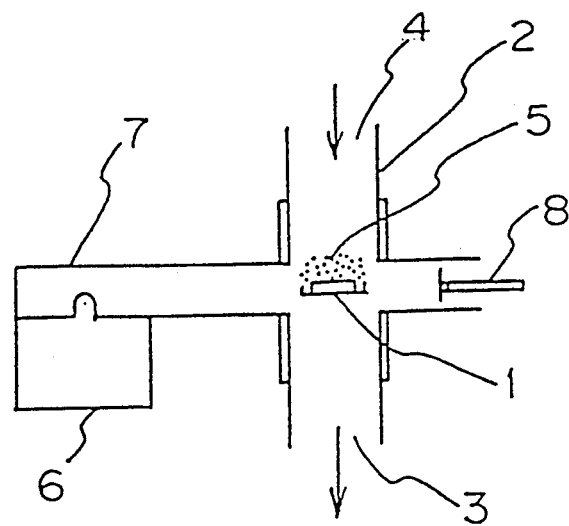
FIGS. 1, 2 and 3 schematically show a microwave plasma CVD apparatus, a radio-frequency plasma CVD apparatus and a direct current plasma CVD apparatus, respectively.

In the method of the present invention, preferably the molar ratios satisfy the equations:

$$0.01 \leq \frac{B}{A+B+C} \leq 0.95$$

and $$0.002 \leq \frac{C}{A+B+C} \leq 0.08,$$

and the plasma is generated under pressure of 30 to 600 Torr. More preferably, the molar ratios satisfy the equations:

$$0.05 \leq \frac{B}{A+B+C} \leq 0.8$$

and $$0.005 \leq \frac{C}{A+B+C} \leq 0.05,$$

and the plasma is generated under pressure of 60 to 400 Torr.

As the low temperature plasma generating source, either the direct current electromagnetic field or the alternating current electromagnetic field may be used. In the latter, radio-frequency or microwaves with a frequency of at least 1 KHz are preferably used because of good operability. Microwaves with a frequency of 500 MHz or larger are more preferable. Generally, a making electric power is at least 1 W/cm².

Examples of the inert gas are helium, neon, argon, krypton, xenon and mixtures thereof. Among them, argon is preferred since it is economically available.

The carbon-containing compound may be any of the compounds which comprise at least one carbon atom and are in a gas state under the CVD conditions. Examples of such carbon-containing compound are aliphatic hydrocarbons such as methane, ethane and ethylene, aromatic hydrocarbons such as benzene, inorganic compounds such as carbon monoxide and carbon dioxide and organic compounds having at least one hetero atom (e.g. oxygen, nitrogen and sulfur) such as alcohols, thiols, ketones and ethers.

The flow rate of the gas mixture is usually from 0.1 cm$^3$/sec. to 5 cm$^3$/sec.

In the method of the present invention, since the inert gas is present in the plasma generating atmosphere, the plasma with high activity can be stably generated not only at conventional plasma output such as several ten watts or higher but also at relatively low plasma output lower than several ten watts under pressure of several hundred Torr. Then, the diamond can be deposited on a surface of three dimensional article on which the deposition of the diamond has been difficult at an appropriate substrate temperature of 700° to 1,200° C. since the plasma is concentrated.

In the present invention, there is no substantial pressure difference between the place where the plasma is generated and the place where the diamond is deposited on the substrate. The pressure difference between two places is preferably less than 2 Torr, more preferably less than 0.5 Torr, in particular substantially 0 (zero).

The substrate material may be the same as those used in the conventional CVD methods. Preferred substrates include Si, Mo, W, Ta, Nb, Zr, B, C, Al, SiC, Si$_3$N$_4$, MoC, Mo$_2$C, WC, W$_2$C, TaC, NbC, BN, B$_4$C, AlN, TiC, TiN, Ti, etc.

Under the CVD conditions according to the present invention, a diamond particle having a particle size of several hundred, for example, 300 to 900 micrometers can be grown at a high deposition rate.

The plasma with high activity can be confirmed with emission spectral analysis or visual observation. Namely, according to the emission spectral analysis, the plasma with high activity is characterized in that the intensity of the continuous H$_2$ band is relatively weak while the intensities for the hydrogen radicals such as H($\alpha$) and C$_2$ and CH radicals are strong. Through visual observation, greenish emission due to the C$_2$ radical (the Swan band) is often observed. These phenomena indicate that, under the plasma CVD conditions according to the present invention, the raw material gas may be more effectively decomposed than under the conventional conditions.

The effects of the addition of the inert gas are achieved in the pressure rage from 5 Torr to 760 Torr. In general, under lower pressure, the deposition rate of the diamond is smaller, while under higher pressure, the deposition area is decreased since the plasma is significantly shrinks. Then, the preferred pressure range is from 30 Torr. to 600 Torr. To increase the deposition rate on a practical deposition area (e.g. several ten square millimeter), the pressure range is preferably from 60 Torr. to 400 Torr.

When the raw material mixture contains a doping material (D) such as diborane (B$_2$H$_6$) and nitrogen (N$_2$) in addition to the hydrogen gas (A), the inert gas (B) and the carbon-containing compound (C), the effects of the addition of the inert gas are achieved in the same way as above. When the doping compound is used, preferably, the molar ratio of the doping material (D) to the total mole of the compounds (A), (B), (C) and (D) satisfy the equation:

$$\frac{D}{A + B + C + D} \leq 0.4$$

When this molar ratio is larger than 0.4, the effects of the present invention are unsatisfactorily achieved.

The observation of the average crystalline particle size (E) in the grown diamond film surface and the film thickness (F) with an optical microscope and a scanning electron microscope has revealed that the average crystalline particle size (E) is large in relation to the film thickness (F). According to the observation with a transmission electron microscope, it has been found that the diamond having the relatively large average crystalline particle size has less crystalline defects such as dislocations or less grain boundaries at which non-diamond materials such as amorphous carbon seem to deposit. This indicates that the diamond of the present invention is a less defective crystal.

The diamond produced by the method of the present invention has various properties which are inherent to the diamond such as high optical transmission which is confirmed through the measurement of transmission spectrum in a range from ultraviolet light to infrared light and large heat conductivity which is confirmed through the measurement of the coefficient of thermal conductivity.

The crystalline particle size has good influences on the property of the diamond, when the thickness (F) is not smaller than 5 $\mu$m and the average crystalline particle size (E) and the film thickness (F) satisfy the following equation:

$$0.3 \leq E/\sqrt{F} \leq 3.$$

When the ratio $E/\sqrt{F}$ is smaller than 0.3 or larger than 3, the characteristics of the diamond are deteriorated.

According to the method of the present invention, the diamond which satisfies the above equation can be easily produced.

Figure 2:
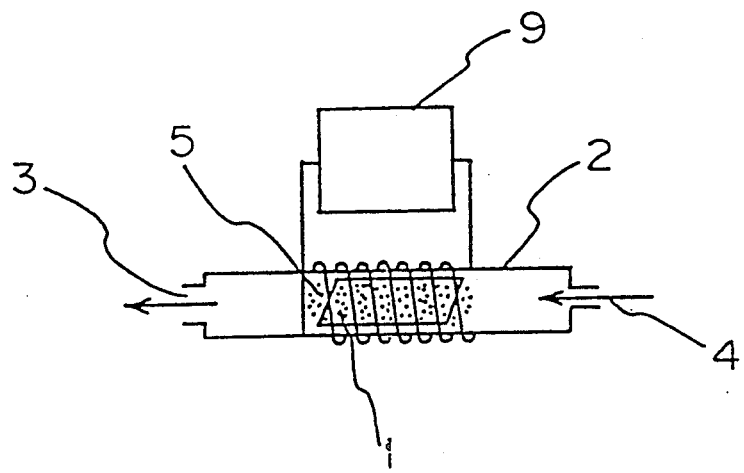
Figure 3:
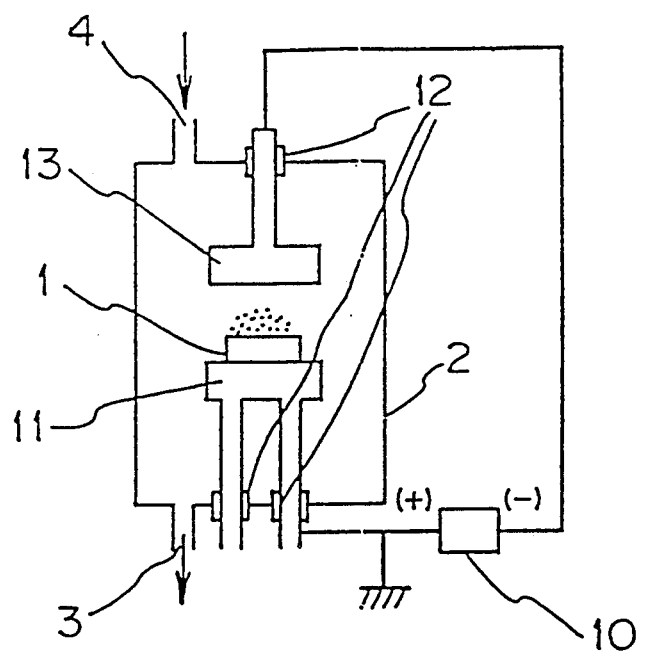

Examples of apparatuses to be used in the method of the present invention are shown in FIGS. 1, 2 and 3, which show a microwave plasma CVD apparatus, a radio-frequency plasma CVD apparatus and a direct current plasma CVD apparatus, respectively. In figures, 1 stands for a substrate, 2 stands for a quartz made reaction tube, 3 stands for an evacuation port, 4 stands for an inlet for introducing the gas mixture, 5 stands for a generated plasma, 6 stands for a magnetron, 7 stands for a waveguide, 8 stands for a plunger, 9 stands for an RF power source, 10 stands for a DC power source, 11 stands for a support for the substrate, 12 stands for an insulating seal, and 13 stands for a cathode. Generally, the reactor tube has a diameter not smaller than 50 mm.

PREFERRED EMBODIMENTS OF THE INVENTION

Example 1

For synthesizing the diamond, either one of the microwave plasma CVD method (hereinafter referred to as "MW-PCVD", the radio-frequency plasma CVD method (hereinafter referred to as "RF-PCVD") and the direct current plasma CVD method (hereinafter referred to as "DC-PCVD") was employed (see Tables 1 and 2). The used substrate was a molybdenum plate (40mm×35 mm×10 mm) which had been finally abrased with #600 diamond powder.

In the quartz tube 2, the inert gas specified in Tables 1 and 2 was introduced through the inlet 4. The plasma 5 was generated with the plasma generator under pressure of 1 Torr to clean the molybdenum plate for 5 minutes. Thereafter, the plasma CVD was carried out under the conditions shown in Tables 1 and 2 to cover the molybdenum plate with the synthesized diamond. The pressure indicated in Tables 1 and 2 were the pressure in the quartz tube in which the plasma was generated and the diamond was deposited.

During the synthesis of the diamond, the surface temperature of the molybdenum plate was monitored with an optical pyrometer and found to be from 800° C. to 1,200° C.

On the diamond synthesized by the plasma CVD method, the surface condition and film thickness were observed with the scanning electron micrometer, and the crystallinity was evaluated with the X-ray diffraction and the Raman spectrometry. The results are shown in Tables 3 and 4, in which "Dia" and "a-c" represent the diamond and the amorphous carbon, respectively.

When the molar ratio of the inert gas to the total mole of the gasses, the molar ratio of the carbon-containing compound to the total mole of the gasses and the reaction pressure are all in the ranges defined by the present invention, the deposition rate of the diamond can be increased greatly, for example up to 400 μm/h. On the contrary, outside the ranges of the present invention, the plasma cannot be stably generated under high pressure in the absence of the inert gas. If the plasma can be generated, the produced diamond has inferior properties such that it contains the amorphous carbon, and the deposition rate will be at most 2 μm/h.

The thermal conductivity of the sample Nos. 18–22 was measured with a thermal conductivity measuring device employing a simple thermistor. The samples produced under the conditions of the present invention had high thermal conductivity of from 2 W/cm.K to 15 W/cm.K, while those produced under the comparative conditions had the thermal conductivity of lower than 2 W/cm.K.

TABLE 1

| Sample No. | CVD | Gasses (SCCM) $H_2$ (A) | Inert gas (B) | C-cont. gas (C) | | Molar ratio B/(A + B + C) | Molar ratio C/(A + B + C) | Pressure (Torr.) | Time (hrs.) |
| --- | --- | --- | --- | --- | --- | --- | --- | --- | --- |
| 1 | MW-PCVD | 2750 | Ar (250) | $CH_4$ | (55) | 0.082 | 0.018 | 200 | 1 |
| 2 | MW-PCVD | 2000 | Ar (1000) | $CH_4$ | (40) | 0.330 | 0.013 | 300 | 3 |
| 3 | MW-PCVD | 500 | Ar (500) | $CH_4$ | (20) | 0.490 | 0.0196 | 80 | 10 |
| 4 | MW-PCVD | 1000 | He (2000) | $CH_4$ | (20) | 0.662 | 0.0066 | 400 | 1 |
| 5 | MW-PCVD | 1000 | Ar (5000) | $CH_3OH$ | (20) | 0.831 | 0.0033 | 600 | 2 |
| 6 | MW-PCVD | 4000 | Ne (20) | $C_2H_2$ | (40) | 0.0049 | 0.0099 | 150 | 2 |
| 7 | RF-PCVD | 4000 | Ar (20) | $C_2H_5OH$ | (20) | 0.0050 | 0.0050 | 200 | 1 |
| 8 | DC-PCVD | 2000 | Ar (1000) | $CH_4$ | (40) | 0.329 | 0.013 | 300 | 1 |
| 9 | DC-PCVD | 5000 | Ar (200) | $CH_3COCH_3$ | (40) | 0.038 | 0.0076 | 150 | 2 |
| 10 | MW-PCVD | 2000 | Ar (1000) | CO | (300) | 0.303 | 0.0909 | 150 | 1 |
| 11 | MW-PCVD | 2000 | Ar (1000) | CO | (250) | 0.308 | 0.0769 | 160 | 1 |
| 12 | MW-PCVD | 2000 | Ar (20000) | $CH_4$ | (40) | 0.907 | 0.0018 | 200 | 1 |
| 13 | MW-PCVD | 200 | Ar (100) | $CH_4$ | (4) | 0.329 | 0.0132 | 200 | 1 |
| 14 | MW-PCVD | 400 | Ar (20) | $CH_4$ | (8) | 0.0467 | 0.0187 | 150 | 1 |
| C15 | MW-PCVD | 1000 | — | $CH_4$ | (4) | — | 0.01 | 400 | 1 |
| C16 | MW-PCVD | 100 | Ar (200) | $CH_4$ | (100) | 0.5 | 0.25 | 80 | 1 |
| C17 | DC-PCVD | 1000 | — | $CH_4$ | (20) | — | 0.02 | 80 | 2 |

TABLE 2

| Sample No. | CVD | Gasses (SCCM) $H_2$ (A) | Inert gas (B) | C-cont. gas (C) | | Molar ratio B/(A + B + C) | Molar ratio C/(A + B + C) | Pressure (Torr.) | Time (hrs.) |
| --- | --- | --- | --- | --- | --- | --- | --- | --- | --- |
| 18 | MW-PCVD | 2000 | Ar (1000) | $CH_4$ | (40) | 0.330 | 0.013 | 200 | 1 |
| 19 | MW-PCVD | 1000 | Ar (500) | $C_2H_5OH$ | (30) | 0.327 | 0.0196 | 150 | 0.5 |
| 20 | MW-PCVD | 200 | Ar (50) | $CH_4$ | (4) | 0.197 | 0.0157 | 250 | 1 |
| C21 | MW-PCVD | 100 | — | $CH_4$ | (1) | — | 0.01 | 40 | 10 |
| C22 | MW-PCVD | 200 | — | $CH_4$ | (1) | — | 0.005 | 20 | 100 |

TABLE 3

| Sample No. | Deposition rate (μm/h) | Film thickness (μm) | X-ray diffraction | Raman spectrometry | Remarks |
| --- | --- | --- | --- | --- | --- |
| 1 | 25 | 25 | Dia | Dia | |
| 2 | 100 | 300 | Dia | Dia | |
| 3 | 20 | 200 | Dia | Dia | |
| 4 | 200 | 200 | Dia | Dia | Small deposited area 20 × 20 mm² |
| 5 | 400 | 800 | Dia | Dia | Small ?deposited area 10 × 10 mm² |
| 6 | 80 | 160 | Dia | Dia | Small deposited area 10 × 10 mm² |
| 7 | 25 | 25 | Dia | Dia | |
| 8 | 100 | 100 | Dia | Dia | |
| 9 | 20 | 200 | Dia | Dia | |
| 10 | 80 | 80 | Dia | Dia | |
| 11 | 100 | 100 | Dia | Dia | |
| 12 | 40 | 40 | Dia | Dia | |
| 13 | 10 | 10 | Dia | Dia | |
| 14 | 18 | 18 | Dia | Dia | |
| C15 | — | — | — | — | No plasma generated |
| C16 | 20 | 20 | — | (Dia) + a-c | *1) |
| C17 | 2 | 4 | Dia | Dia | *2) |

TABLE 3-continued

| Sample No. | Deposition rate (μm/h) | Film thickness (μm) | X-ray diffraction | Raman spectrometry | Remarks |
| --- | --- | --- | --- | --- | --- |
| | | | | + a-c | |

Note:
*1) The reaction tube was contaminated. The plasma often stopped.
*2) According to the composition analysis, contaminations from the electrode material were found.

TABLE 4

| Sample No. | Deposition rate (μm/h) | Film thickness (μm) | E/√F | X-ray diffraction | Raman spectrometry |
| --- | --- | --- | --- | --- | --- |
| 18 | 50 | 50 | 0.8 | Dia | Dia |
| 19 | 40 | 20 | 0.5 | Dia | Dia |
| 20 | 20 | 20 | 2.0 | Dia | Dia |
| C21 | 0.5 | 5 | 0.2 | Dia | Dia |
| C22 | 0.2 | 20 | 0.1 | Dia | Dia |

Example 2

The diamond film peeled off from the sample No. 4 shown in Table 1 (10 mm × 10 mm × 0.2 mm) was placed on a molybdenum plate (40 mm × 34 mm × 10 mm) and then the MW plasma CVD was carried out thereon for 3 hours at the microwave output of 800 W under pressure of 300 Torr. while flowing hydrogen, argon and ethanol at flow rates of 1,000 SCCM, 500 SCCM and 40 SCCM, respectively. The diamond grew in thickness from 0.2 mm to 1 mm. Like the sample No. 4, the produced diamond plate had good crystallinity and the preferential orientation in the (100) direction according to the X-ray diffraction and the Raman spectrometry.

Example 3

At the center of a round molybdenum plate of 40 mm in diameter and 20 mm in thickness, five particles of single crystal diamond each having the particle size of 250 μm which had been produced by the ultra-high pressure method, and then the MW plasma CVD was carried out thereon for 5 hours at the microwave output of 800 W under pressure of 500 Torr. while flowing argon, hydrogen and acetylene at flow rates of 2,000 SCCM, 1,000 SCCM and 20 SCCM, respectively to obtain five particles of single crystal diamond each having a diameter of 1 mm. The diamond had good crystallinity according to the X-ray diffraction and the Raman spectrometry.

Example 4

At the center of a molybdenum plate (40 mm × 35 mm × 10 mm), one particle of single crystal diamond having the diameter of 3 mm which had been produced by the ultra-high pressure method, and then the MW plasma CVD was carried out thereon for 5 hours at the microwave output of 200 W under pressure of 600 Torr. while flowing helium, hydrogen and propane at flow rates of 2,000 SCCM, 500 SCCM and 20 SCCM, respectively to obtain a diamond particle having a diameter of 4 mm.

The surface of the obtained diamond was slightly graphited. As the treatment with cromic acid proceeded, the diamond shape clearly appeared. This was confirmed by the X-ray diffraction and the Raman spectrometry.

Example 5

A round molybdenum plate of 40 mm in diameter and 30 mm in thickness was abrased with #600 diamond powder. On the abrased molybdenum plate, the MW plasma CVD was carried out for 1 hour at the microwave output of 1.5 KW under pressure of 760 Torr. while flowing argon, hydrogen and methane at flow rates of 200 SCCM, 200 SCCM and 4 SCCM, respectively to obtain a diamond particle having a diameter of 500 μm at the center of the molybdenum plate. This was identified as diamond by the X-ray diffracton and the Raman spectrometry.

What is claimed is:

1. A method for producing diamond which comprises steps of:

introducing a mixture of hydrogen (A), an inert gas (B) and a carbon-containing compound (C) in molar ratios which satisfy the following equations:

$$0.001 \leq \frac{B}{A + B + C} \leq 0.95$$

and $$0.001 \leq \frac{C}{A + B + C} \leq 0.1,$$

generating a low temperature plasma with one of a direct current and an alternating current electromagnetic field under pressure in the range from 30 to 600 Torr to form the diamond on a substrate, wherein there is no substantial pressure difference between a place where the plasma is generated and a place where the diamond is formed on the substrate.

2. The method according to claim 1, wherein the molar ratios of the compounds (A), (B) and (C) satisfy the following equations:

$$0.01 \leq \frac{B}{A + B + C} \leq 0.95$$

and $$0.002 \leq \frac{C}{A + B + C} \leq 0.08.$$

3. The method according to claim 1, wherein the molar ratios of the compounds (A), (B) and (C) satisfy the following equations:

$$0.05 \leq \frac{B}{A + B + C} \leq 0.8$$

and $$0.005 \leq \frac{C}{A + B + C} \leq 0.05,$$

and the pressure is from 60 to 400 Torr.

4. The method according to claim 1, wherein the inert gas is at least one selected from the group consisting of helium, neon, argon, krypton and xenon.

5. The method according to claim 4, wherein the inert gas is argon.

6. The method according to claim 1, wherein the carbon-containing compound is a hydrocarbon.

7. The method according to claim 1, wherein the carbon-containing compound is carbon monoxide or carbon dioxide.

8. The method according to claim 1, wherein the carbon-containing compound is an organic compound having at least one hetero atom.

9. The method according to claim 1, wherein the mixture of the compounds (A), (B) and (C) further comprises a doping compound (D).

10. The method according to claim 1, wherein the molar ratio of the doping compound (D) to the total mole of the compounds (A), (B), (C) and (D) is not larger than 0.4.

11. The method according to claim 1, wherein a flow rate of said mixture is from 254 SCCM to 6020 SCCM.

* * * * *